(12) United States Patent
Hwang

(10) Patent No.: US 7,857,571 B2
(45) Date of Patent: Dec. 28, 2010

(54) APPARATUS FOR MANUFACTURING FLAT PANEL DISPLAY AND METHOD OF MANUFACTURING THE SAME

(75) Inventor: Yoon Ho Hwang, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 698 days.

(21) Appl. No.: 11/450,287

(22) Filed: Jun. 12, 2006

(65) Prior Publication Data
US 2007/0154298 A1 Jul. 5, 2007

(30) Foreign Application Priority Data
Dec. 29, 2005 (KR) ...................... 10-2005-0133997

(51) Int. Cl.
*B65H 5/06* (2006.01)
(52) U.S. Cl. .............. 414/222.01; 414/278; 414/331.17
(58) Field of Classification Search ............ 414/331.14, 414/331.17, 331.18, 416.03, 416.08, 278, 414/222.01; 294/64.1, 64.3; 187/267, 268
See application file for complete search history.

(56) References Cited

U.S. PATENT DOCUMENTS

| | | | |
|---|---|---|---|
| 5,036,951 A | * | 8/1991 | Frangos .................. 187/214 |
| 5,599,154 A | * | 2/1997 | Holscher et al. ............ 414/278 |

| | | | |
|---|---|---|---|
| 2003/0178468 A1 | | 9/2003 | Lee et al. |
| 2005/0089388 A1 | | 4/2005 | Park |

FOREIGN PATENT DOCUMENTS

| | | |
|---|---|---|
| CN | 1445588 A | 10/2003 |
| CN | 1611429 A | 5/2005 |
| JP | 01-297835 | 11/1989 |
| JP | 2004-179580 | 6/2004 |
| JP | 2004-266014 | 9/2004 |
| JP | 2005-75643 | 3/2005 |
| JP | 2005-317854 | 11/2005 |
| JP | 2005-350174 | 12/2005 |

\* cited by examiner

*Primary Examiner*—Donald Underwood
(74) *Attorney, Agent, or Firm*—Morgan, Lewis & Bockius LLP

(57) ABSTRACT

An apparatus for manufacturing capable of reducing footprint and a working time for loading substrates as short as possible, and a method using the same are disclosed. The apparatus includes a cassette to accommodate a plurality of substrates, a stocker in which the cassette is loaded, a process progressing unit to receive the respective substrates in the cassette and to perform a process, a loader having at least two hands and disposed between the stocker and the process progressing unit to receive and supply the respective substrates accommodated in the cassette on the stocker to the process progressing unit, and at least one withdrawing unit to withdraw and supply the respective substrates from the cassette to at least one of the hands in the loader.

7 Claims, 6 Drawing Sheets

APPARATUS FOR MANUFACTURING FLAT PANEL DISPLAY AND METHOD OF MANUFACTURING THE SAME

This application claims the benefit of Korean Patent Application No. 10-2005-133997, filed on Dec. 29, 2005, which is hereby incorporated by reference as if fully set forth herein.

BACKGROUND OF THE INVENTION

1. Field of the Invention

The present invention relates to an apparatus for manufacturing flat panel displays and a method of manufacturing the same, and more particularly to a structure to transfer substrates of the flat panel displays to respective processes and a method of transferring the same.

2. Discussion of the Related Art

Generally, a flat panel display device is a display device designed to reduce big volume and heavy weight, and other disadvantages of a cathode ray tube. Flat panel display devices include liquid crystal displays, field emission displays, plasma display panels, and light emitting displays.

Of these liquid crystal display includes a liquid crystal panel and a drive for applying a driving signal to the liquid crystal panel. The liquid crystal panel includes a pair of substrates assembled to each other to maintain a predetermined space and a liquid crystal layer in the space between the substrates. Here, the respective substrates or the assembled substrate made by assembling the substrates are carried to or withdrawn from various processing sites by a carrier such as a robot arm.

FIG. 1 illustrates a layout of a related art apparatus for carrying substrates. In other words, the layout of the related art apparatus for carrying the substrates is structured such that substrates 1 in a cassette 10 stored in a stocker 20 are respectively carried to a stage 40. A robot arm 50 then loads and transfers the substrates 1 that are carried to the stage 40, to a processing device 60. At this time, the robot arm 50 has a hand 51 which rotates and moves forward and backward.

However, the layout of the related art apparatus for carrying substrates has disadvantages which are represented by large overall footprints due to the stage 40. Moreover, when withdrawing the substrates 1 from the cassette 10 and further transferring the substrates 1 to the processing device 60, the overall working time is long. This is because in the process of withdrawing the substrates 1 from the cassette 10, the hand 51 of the robot arm 50 is operated such that it enters from under the lower sides of the respective substrates 1 and also because the robot arm 50 withdraws and transfers the substrates 1 individually. Also, since the respective substrates 1 must be maintained by minimum gaps through which the hand 51 of the robot arm 50 sufficiently enters, the number of the substrates 1 accommodated in the cassette 10 is difficult to increase.

SUMMARY OF THE INVENTION

Accordingly, present invention is directed to an apparatus for manufacturing flat panel displays and a method thereof that substantially obviate one or more problems due to limitations and disadvantages of the related art.

An object of the present invention is to provide an apparatus for manufacturing flat panel displays which is capable of reducing both footprints and working time for loading substrates, a method of manufacturing the same, a stocker employed in the apparatus, and a loader employed in the apparatus.

Additional features and advantages of the invention will be set forth in part in the description which follows, and in part will be apparent from the description, or may be learned by practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an apparatus for manufacturing flat panel displays including a cassette to accommodate a plurality of substrates, a stocker in which the cassette is loaded, a process progressing unit to receive the respective substrates in the cassette and to perform a process, a loader having at least two hands and disposed between the stocker and the process progressing unit to receive and supply the respective substrates accommodated in the cassette on the stocker to the process progressing unit, and at least one withdrawing unit to withdraw and supply the respective substrates from the cassette to at least one of the hands in the loader.

In another aspect of the present invention, a stocker of an apparatus for manufacturing flat panel displays includes shelves on which cassette accommodating a plurality of substrates is placed, frames provided in the lower sides of the shelves, at least one rolling unit installed in the upper sides of the frames, a driving unit to roll the rolling unit, and an elevating unit to elevate the shelves.

In still another aspect of the present invention, a loader of an apparatus for manufacturing flat panel displays includes a body, at least two hands coupled with the body to load substrates on the upper sides thereof, and at least one roller provided in the upper side of any one of the respective hands.

In still another aspect of the present invention, a method of manufacturing flat panel displays includes the steps of supplying a cassette in which a plurality of substrates is accommodated on shelves of a stocker, withdrawing the substrates in the cassette successively by driving a withdrawing unit installed in the stocker and supplying the withdrawn substrates to a loader, and controlling the loader to supply the received substrates to a process progressing unit.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
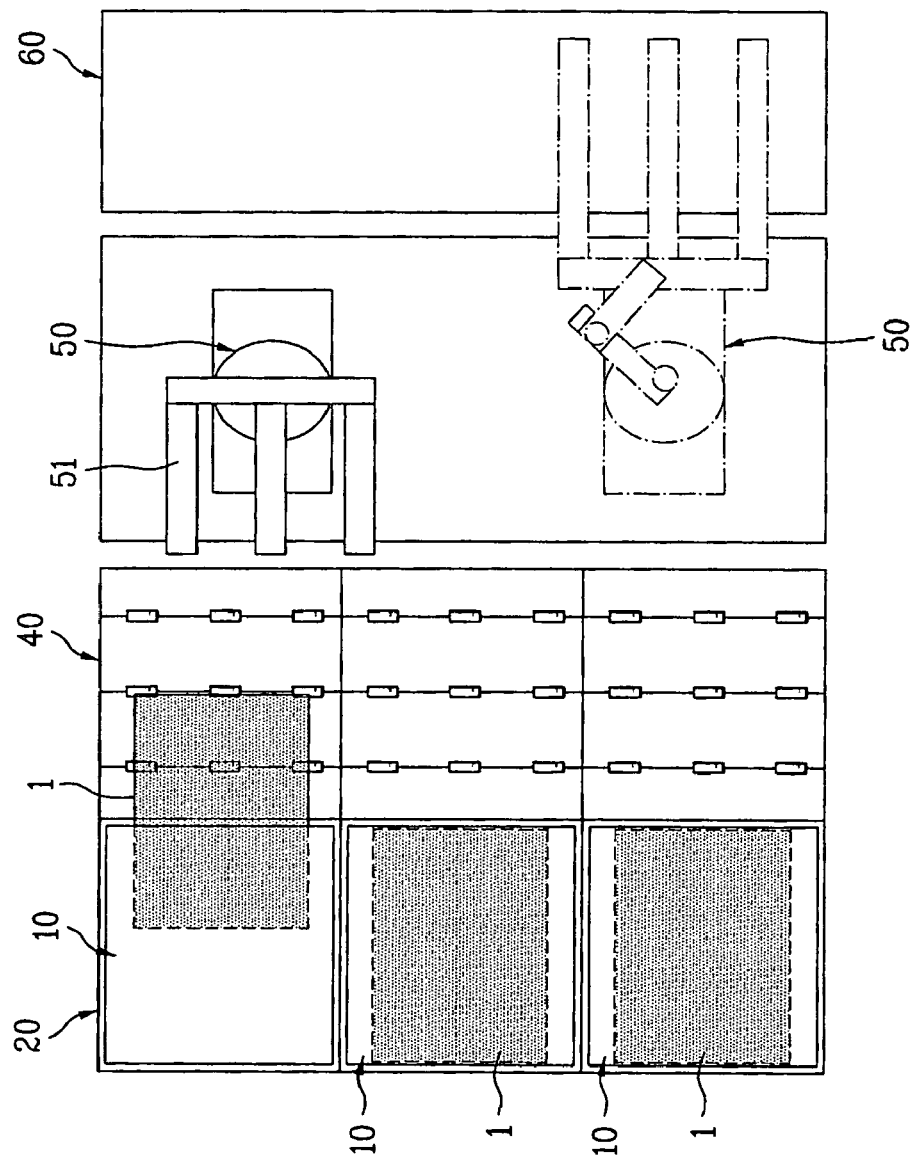
FIG. 1 is a schematic plan view illustrating the layout of a related art apparatus for manufacturing flat panel displays.
Figure 2:
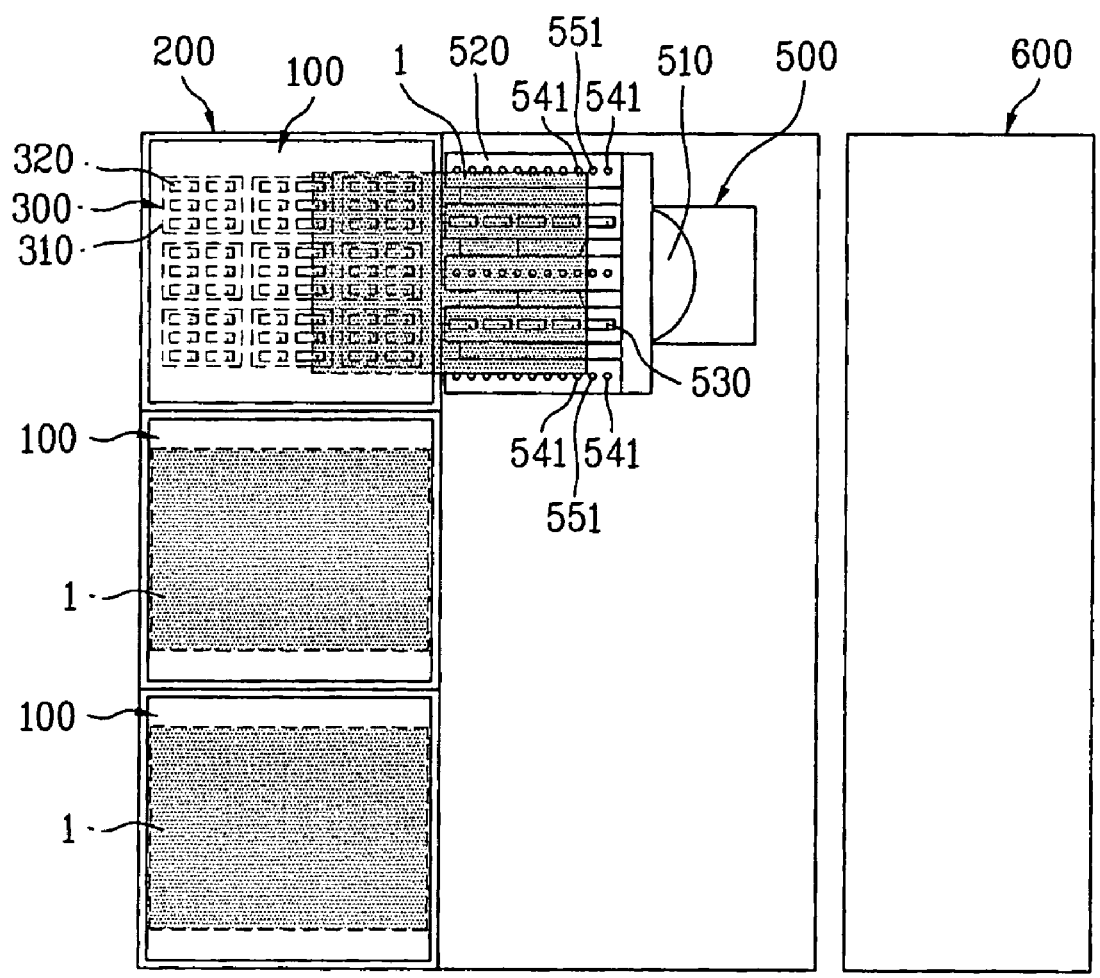
FIG. 2 is a schematic plan view illustrating a layout of the apparatus for manufacturing flat panel displays according to an exemplary embodiment of the present invention.

FIG. 2 is a schematic plan view illustrating an exemplary layout of the apparatus for manufacturing flat panel displays according to the present invention. As shown in the drawing, the apparatus for manufacturing flat panel displays includes a cassette 100, a stocker 200, a process progressing unit 600, a loader 500, and a withdrawing unit 300. The above mentioned components will now be described.

Figure 3:
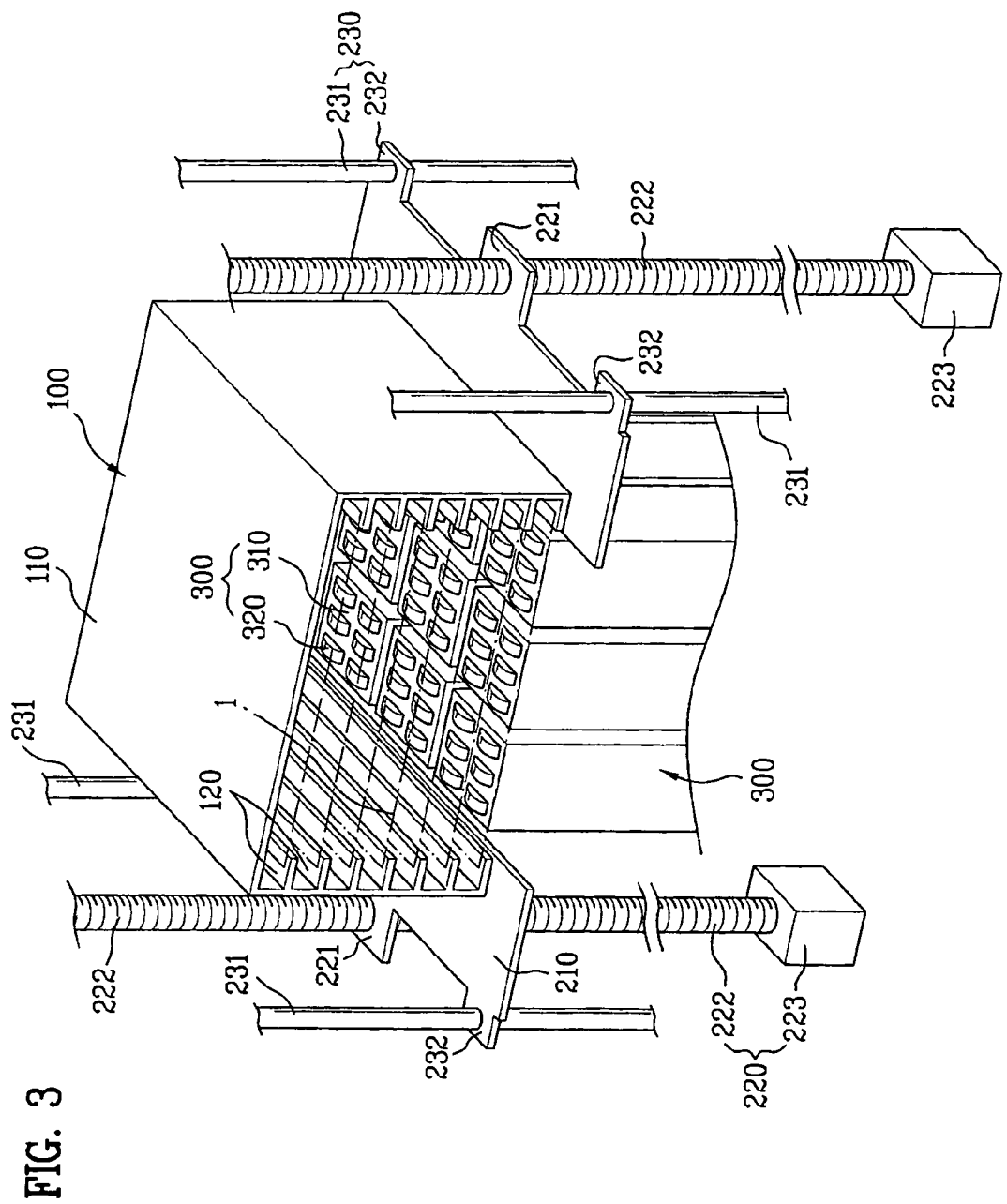
FIG. 3 is a schematic perspective view illustrating main parts of a cassette, a stocker, and a discharging unit of the apparatus for manufacturing flat panel displays according to an exemplary embodiment of the present invention.

First, the cassette 100 will be described with reference to FIGS. 2 and 3. The cassette 100 is structured to carry a plurality of substrates 1 and includes a body 110 and a plurality of loading projections 120. Here, the body 110 forms an external appearance and the bottom of the body 110 is open ended.

Moreover, loading projections 120 are formed in the sidewalls of the body 110 such that the loading projections 120 on the left and right sidewalls correspond to each other along the inner sidewalls of the body 110 when functioning as a load for respective substrates 1. On the respective upper sides of the loading projections 120, the substrates 1 are respectively loaded.

The vertical distance between the respective loading projections 120 is narrower than that of the respective loading projections in a related art cassette 10, but is preferably greater than the thickness of each substrate 1. In the apparatus for manufacturing flat panel displays, the distance does not need to be greater than the thickness of the respective hands 510. Here, the respective hands 510 of the loader 500, which will be described later, do not enter the cassette 100. Thus, a single cassette 100 can accommodate more substrates.

Next, the stocker 200 will be described with reference to FIGS. 2 and 3. The stocker 200 is the part where the cassette 100 is stored and has shelves 210 on which the cassettes 100 are placed. Moreover, the stocker 200 further includes an elevator 220 for elevating and lowering the shelves 210 to keep the height where the substrates 1 are withdrawn from in the cassette 100 uniform.

In this example, any device can be used as the elevator 220 as long as it performs the function of elevating the shelves 210. In other words, the elevator 220 may be a device using stepping motor, ball screws, etc. In the illustrated embodiment, the elevator 220 is a device using the ball screws, for example. Here, the elevator 220 includes coupling brackets 221 coupled with the lateral sides of the shelves 210, ball screws 222 penetrating each of the coupling brackets 221, and driving motors 223 to rotate the ball screws 222.

In particular, the stocker 200 further includes a supporting unit 230 to support the elevation of the shelves 210. The supporting unit 230 prevents the shelves 210 from being inclined to a certain direction when the shelves 210 are elevated and guides smooth elevation of the shelves 210. In other words, four corners of the shelves 210 can be supported by the supporting unit 230. In this case, preferably, the supporting unit 230 includes linear motion (LM) guides 231 for supporting the four corners of the shelves 210 and guide brackets 232 formed in the four corners of the shelves 210 that allow the LM guides 231 to penetrate therethrough.

Next, the process progressing unit 600 will be described. The process progressing unit 600 is a part that receives the substrates 1 from the respective cassette 100. The process progressing unit 600 also performs process for manufacturing the flat panel displays. In this case, the process progressing unit 600 includes at least one device used in manufacturing the flat panel displays. Examples of such devices include assembly devices, exposing devices, dispensers, and the like.

Figure 4:
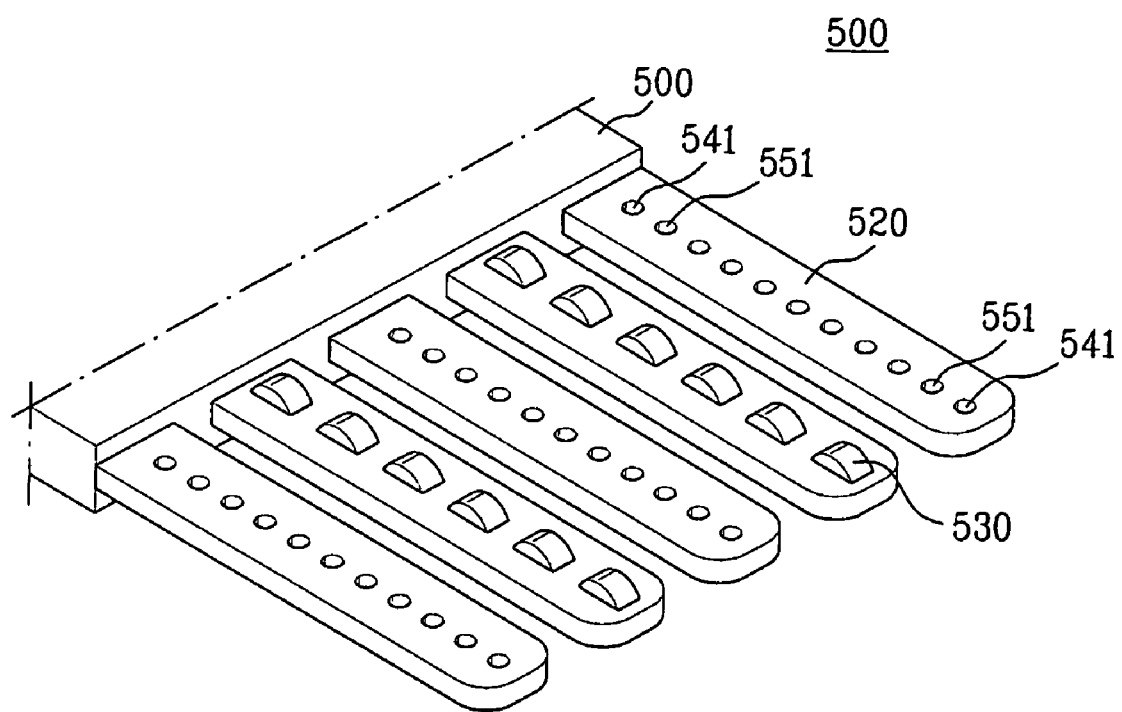
FIG. 4 is a schematic perspective view illustrating main parts of a loader of the apparatus for manufacturing flat panel displays according to an exemplary embodiment of the present invention.

Next, the loader 500 will be described with reference to FIG. 4. The loader 500 is disposed between the stocker 200 and the process progressing unit 600. The loader 500 directly receives the respective substrates 1 from the cassettes 100 which are stored in the stocker 200. Then, the loader 500 transfers the substrates 1 to the process progressing unit 600.

The loader 500 includes a body 510 and at least two hands 520. In this example, the body 510 rotates. Moreover, the respective hands 520 are coupled with the circumference of the body 510. The substrates 1 are loaded onto the hands 520 of the loader 500. Preferably, at least one of the respective hands 520 further includes at least one roller 530. A plurality of rollers 530 are preferably installed in the longitudinal directions of the hands 520. Preferably, the levels of the upper sides of the rollers 530 are nearly equal to the levels of the upper sides of other hands 520. Although not shown in FIG. 4, the hands 520 may further include driving motors for driving the rollers 530. Preferably, the respective hands 520 further include at least one suctioning part for suctioning the substrates 1 loaded thereon to prevent the substrates 1 from being separated from the respective hands 520 due to vibration of the loader 500 during the transfer of the substrates 1. The suctioning unit includes vacuum holes 541 penetrating through the upper sides of the respective hands 520, a vacuum pump (not shown) for generating an air suctioning force, and a vacuum passageway (not shown) for transmitting the air suctioning force to the vacuum holes 541. Preferably, the respective hands 520 further include air discharging units for discharging air upward to prevent the substrates 1 from being scratched by the respective hands 520 during the loading of the substrates 1 onto the respective hands 520. The air discharge ports include air discharge holes 551 penetrating through the upper sides of the respective hands 520, an air discharge pump (not shown) for generating an air discharging force, and an air passageway (not shown) for transmitting the air discharging force to the discharge holes 551. In this example, the air discharge holes 551 are preferably formed at other positions in the longitudinal directions, different from the positions of the vacuum holes 541 in the respective hands 520.

Next, the withdrawing unit 300 will be described with reference to FIGS. 2 and 3. The withdrawing unit 300 is structured to withdraw the respective substrates 1 from the cassettes 100 and to load the same on the upper sides of the respective hands 520. The number of the withdrawing unit 300 is at least one. The withdrawing unit 300 includes a frame 310, a rolling unit 320, and a driving unit which is not shown. Here, the frame 310 is structured to be disposed in the lower sides of the shelves 210 of the stocker 200 and to form the body of the withdrawing unit 300. The number of the frame 310 is preferably at least one. Moreover, the rolling units 320 are rollers installed on the upper side of the frame 310. Preferably, a plurality of rolling units 320 (at least one) are provided along the longitudinal direction of the frame 310. Furthermore, the driving unit which is not shown serves as a power source to drive the rolling units 320. In this example, the driving unit may include a motor. Particularly, when the number of the frame 310 is more than one, the driving unit may be provided to all or some of the rolling units 320. The driving unit may be structured such that all the rolling units are connected to each other by a belt or a chain with a single driving unit driving the whole rolling units 320 simultaneously. The driving units are respectively installed in the respective frames 310.

Hereinafter, the process of carrying the substrates 1 accommodated in the cassettes 100 to the process progressing unit 600 using the apparatus for manufacturing flat panel displays according to the present invention will now be described.

First, the cassettes 100 are provided on the shelves 210 of the stocker 200. The cassettes 100 may be carried on the shelves 210 by a separate loader not depicted in the drawings or by a conveyor. A plurality of substrates 1 are accommodated in the cassettes 100 at a predetermined distance therebetween, as shown in FIG. 3.

In this state, when the process is progressed, the loader 500 is driven and the respective hands 520 of the loader 500 are positioned to face the stocker 200 and to preparing to receive the substrates 1. At this time, the respective hands 520 are positioned at the height approximately equal to the height of the rolling units 320 of the withdrawing unit 300, and the ends of the respective hands 520 are positioned at the substrate withdrawing sides of the withdrawing unit 300.

When the above sequential process is completed, the driving motor 223 of the elevator 220 is driven to rotate the ball screws 222 so that the shelves 210, in which the ball screws 222 are coupled to via brackets 221, move down according to the rotation of the ball screws 222. The guide brackets 232 of the supporting unit 230 are supported by the respective LM guides 231 so that the shelves 210 move down steadily.

Figure 5:
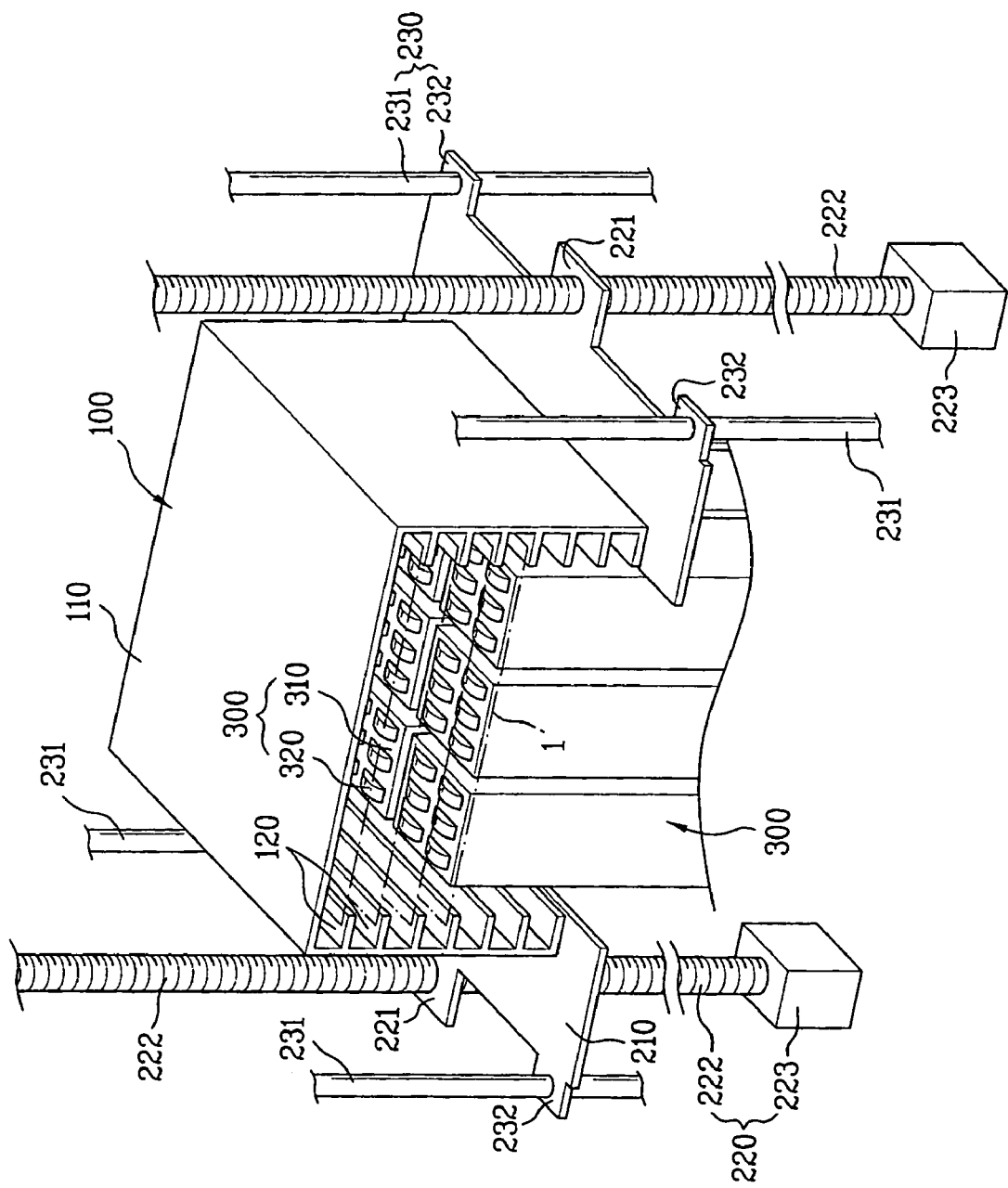
FIG. 5 is a perspective view illustrating exemplary operation of the apparatus for manufacturing flat panel displays according to an exemplary embodiment of the present invention.

The downward traveling distance of the shelves 210 is set such that the lowermost of the substrates 1 accommodated in the cassettes 100 contact the rolling units 320 of the withdrawing unit 300. If the lowermost substrate 1 of the substrates 1 accommodated in the cassettes 100 is positioned about at the intermediate position of the cassettes 100, the elevator 220 is driven to make the state as shown in FIG. 5. The distance is preferably checked by a separate positioning sensor which is not shown in the drawings.

When the downward movements of the shelves 210 are completed, the driving unit (not shown) of the withdrawing unit 300 is driven. The rolling units 320 are also driven correspondingly. Having done so, the substrate 1 contacting the upper sides of the rolling units 320 is withdrawn from the cassette 100. The substrate 1 is further provided onto the upper sides of the respective hands 520 of the loader 500, as shown in FIG. 2. Here, the loader 500 controls the air discharging units provided in the respective hands 520 to drive the air discharge pump so that air is discharged through the discharge holes 551. Thus, the substrates 1 provided on the upper sides of the respective hands 520 do not contact the upper sides of the respective hands 520 so that the substrates 1 are prevented from being scratched by the upper sides of the respective hands 520. Furthermore, the substrates 1 provided on the upper sides of the respective hands 520 are loaded onto the upper sides of the respective hands 520 more steadily using the rollers 520 provided on at least one of the respective hands 520.

When the substrates 1 on the upper sides of the respective hands 520 are loaded, the loader 500 stops the air discharge pump and controls the air suctioning unit to drive the vacuum pump to supply an air suctioning force through the vacuum holes 541. By doing so, the substrates 1 are suctioned and fixed on the upper sides of the respective hands 520 and are prevented from flowing even when the loader 500 is moving.

Figure 6:
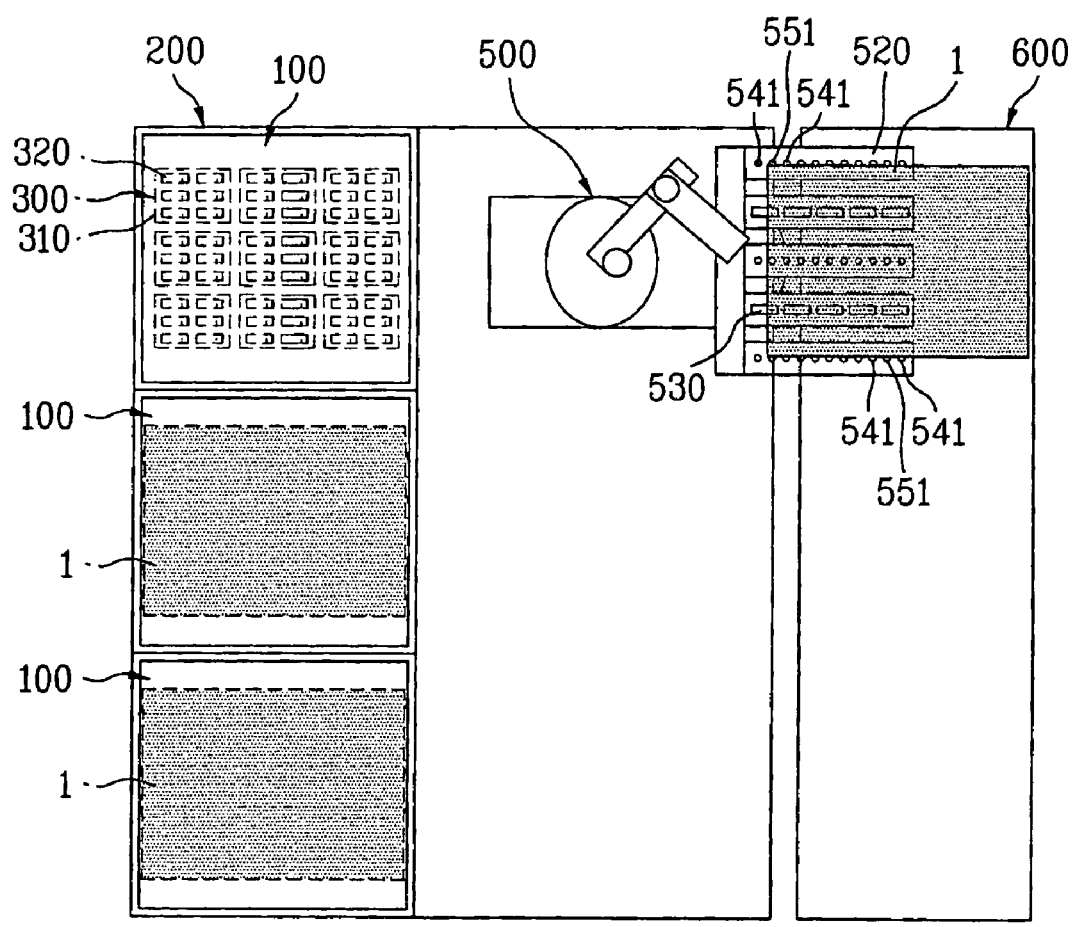
FIG. 6 is a plan view illustrating exemplary operation of the apparatus for manufacturing flat panel displays according to an exemplary embodiment of the present invention.

After this, the loader 500 rotates by 180 degrees and transfers the substrates 1 to the process progressing unit 600. This state is depicted in FIG. 6. The loader 500 controls the elevator 220 during the transferring of the substrates 1 to the process progressing unit 600 such that the shelves 210 of the stocker 200 are driven to move down step by step. Preferably, the driving unit of the withdrawing unit 300 is not driven at this time.

The sequential processes as described above are performed repeatedly so that the substrates 1 accommodated in the cassettes 100 are carried to the process progressing unit 600 for the corresponding process to be performed. The substrates 1 completely processed in the process progressing unit 600 are then accommodated back into the cassettes 100 in the reverse order of the loading process mentioned above. In other words, the completely processed substrates 1 are provided from the process progressing unit 600 to the withdrawing unit 600 by the loader 500. Next, the substrates 1 placed on the upper sides of the respective hands 520 of the loader 500 are accommodated into the cassettes 1 from the uppermost side thereof successively.

Meanwhile, when the stocker 200 of the apparatus for manufacturing flat panel displays is integrally formed with the withdrawing unit 300, only an individual stocker 200 can be applied to a process of manufacturing every flat panel displays. In other words, when the withdrawing unit 300 is integrally formed with the stocker 200, the stocker 200 serves to accommodate the cassettes 100. The stocker 200 also serves to withdraw the substrates 1 accommodated in the cassettes 100 successively or to receive and accommodate the substrates 1 transmitted from exterior into the cassettes 100 successively.

Moreover, the loader 500 of the apparatus for manufacturing flat panel displays of the described exemplary embodiment can be applied to the process of manufacturing every flat panel displays as an individual device. In other words, the loader 500 is structured such that at least one roller is provided on the upper side of any one of the respective hands 520. Therefore, the substrates 1 being scratched due to the contact between the substrates 1 and the upper sides of the respective hands 520 when receiving or providing the substrates 1 can be prevented. Further, since the respective hands 520 include the air discharging units for discharging air upward, the substrates 1 can be prevented from being scratched.

Moreover, the stocker 200 of the apparatus for manufacturing flat panel displays may be structured such that the shelves 210 do not elevate. In other words, the withdrawing unit 300 is structured to elevate the frame 310 as to have the same effect as elevating the shelves 210.

As described above, the apparatus for manufacturing flat panel displays can be modified and changed in various ways. Since the individual components of the apparatus can be applied to other apparatuses, the apparatus for manufacturing flat panel displays of the present invention can be very useful.

In particular, according to the apparatus for manufacturing flat panel displays of the present invention, the following effects can be obtained effects. First, according to the apparatus for manufacturing flat panel displays of the present invention, the stage for transmitting the substrates from the cassettes to the loader is eliminated, and therefore overall footprint is reduced. Second, according to the apparatus for manufacturing flat panel displays of the present invention, during the transferring of the substrates, the substrates are prevented from being scratched due to the contact with the respective hands of the loader. Therefore, the productivity can be increased. Third, according to the apparatus for manufacturing flat panel displays of the present invention, the time required to transfer the substrates is minimized. Fourth, according to the apparatus for manufacturing flat panel displays of the present invention, the number of the substrates accommodated in the cassette is maximized. Fifth, according to the apparatus for manufacturing flat panel displays of the present invention, the stocker and the loader can be used individually and applied to other various processing apparatuses. Therefore, the utility of the manufacturing apparatus of the present invention can increase.

It will be apparent to those skilled in the art that various modifications and variations can be made in the apparatus for manufacturing flat panel display and the method of manufacturing the same of the present invention without departing from the spirit or scope of the invention. Thus, it is intended that the present invention covers the modifications and variations of this invention provided they come within the scope of the appended claims and their equivalents.

What is claimed is:

1. An apparatus for manufacturing flat panel displays, comprising:
   a cassette to accommodate a plurality of substrates;
   a stocker in which the cassette is loaded;
   a process progressing unit to receive the respective substrates in the cassette and to perform a process;
   a loader having at least two hands and disposed between the stocker and the process progressing unit to receive and supply the respective substrates accommodated in the cassette on the stocker to the process progressing unit; and
   at least one withdrawing unit to withdraw and supply the respective substrates from the cassette to at least one of the hands in the loader,
   wherein the stocker includes shelves on which the cassette is loaded and an elevator for elevating the shelves and a supporting unit to support the elevation of the shelves,
   wherein the supporting unit has linear motion guides to support four corners of the shelves,
   wherein the respective hands of the loader comprise at least one suctioning unit to suction the substrate loaded thereon,
   wherein the suctioning unit includes a vacuum holes penetrating the upper sides of the respective hands, a vacuum pump to generate an air suctioning force and a vacuum passageway to transmit the air suctioning force to the vacuum holes,
   wherein the withdrawing unit includes a frame provided adjacent to each lower side of the shelves of the stocker, at least one rolling unit installed in the upper side of the frame to roll and a driving unit to roll the rolling unit,
   wherein each rolling unit includes a plurality of rollers installed on the upper side of the frame,
   wherein the plurality of rollers are provided along the longitudinal direction of the frame,
   wherein the driving unit of the withdrawing unit serves as a driving motor to drive at least some of the plurality of rollers on its respective rolling unit,
   wherein the supporting unit further includes guide brackets formed on the four corners of the shelve, wherein each linear motion guide passes through each guide bracket.

2. The apparatus for manufacturing flat panel displays as set forth in claim 1, wherein the cassette includes:
   a body to form an external appearance having an open ended bottom; and
   a plurality of loading projections, provided in the inner sidewalls of the body in the vertical direction, on which the substrates are loaded.

3. The apparatus for manufacturing flat panel displays as set forth in claim 2, wherein the elevator comprises:
   coupling brackets respectively coupled with the lateral sides of the shelves;
   ball screws penetrating through any one of the respective coupling brackets; and
   driving motors for driving the ball screws.

4. The apparatus for manufacturing flat panel displays as set forth in claim 1, wherein at least one of the hands of the loader comprises at least one roller.

5. The apparatus for manufacturing flat panel displays as set forth in claim 1, wherein the respective hands of the loader further comprise air discharging units to discharge air upward.

6. The apparatus for manufacturing flat panel displays as set forth in claim 5, wherein the air discharging unit comprises:
   discharge holes penetrating the upper sides of the respective hands;
   an air discharge pump to generate an air discharging force; and
   an air passageway to transmit the air discharging force to the discharge holes.

7. A stocker of an apparatus for manufacturing flat panel displays, comprising:
   shelves on which cassette accommodating a plurality of substrates is placed;
   frames provided in the lower sides of the shelves;
   at least one rolling unit installed in the upper sides of the frames;
   a driving unit to roll the rolling unit;
   an elevating unit to elevate the shelves; and
   a supporting unit to support the elevation of the shelves,
   wherein the supporting unit includes linear motion guides to support four corners of the shelves,
   wherein the elevating unit includes coupling brackets respectively coupled with the lateral sides of the shelves, ball screws penetrating through any one of the respective coupling brackets and driving motors to drive the ball screws,
   wherein each rolling unit includes a plurality of rollers installed on the upper side of the frame,
   wherein the plurality of rollers are provided along the longitudinal direction of the frame,
   wherein the driving unit of the withdrawing unit serves as a driving motor to drive at least some of the plurality of rollers on its respective rolling unit,
   wherein the supporting unit further includes guide brackets formed on the four corners of the shelve, wherein each linear motion guide passes through each guide bracket.

* * * * *